United States Patent
Luo et al.

(10) Patent No.: US 6,324,673 B1
(45) Date of Patent: Nov. 27, 2001

(54) METHOD AND APPARATUS FOR EDGE-ENDPOINT-BASED VLSI DESIGN RULE CHECKING

(75) Inventors: Zhen Luo; Margaret Martonosi; Pranav Ashar, all of Princeton, NJ (US)

(73) Assignees: Princeton University; NEC USA, Inc., both of Princeton, NJ (US)

( * ) Notice: Subject to any disclaimer, the term of this patent is extended or adjusted under 35 U.S.C. 154(b) by 0 days.

(21) Appl. No.: 09/321,591

(22) Filed: May 28, 1999

Related U.S. Application Data
(60) Provisional application No. 60/116,047, filed on Jan. 14, 1999.

(51) Int. Cl.[7] .................................................... G06F 17/50
(52) U.S. Cl. ................................ 716/11; 716/19; 716/21; 324/758; 438/17; 438/18
(58) Field of Search .................................. 716/11, 19, 21; 324/758; 438/17, 18

(56) References Cited

U.S. PATENT DOCUMENTS

| | | | |
|---|---|---|---|
| 5,530,372 | * 6/1996 | Lee et al. .............................. | 324/758 |
| 5,640,497 | * 6/1997 | Woolbright ........................... | 716/11 |
| 5,675,499 | * 10/1997 | Lee et al. ................................ | 716/19 |
| 5,923,566 | * 7/1999 | Galan et al. ........................... | 716/21 |

OTHER PUBLICATIONS

Pleskacz, et al.; "A DRC–Based Algorithm for Extraction of Critical Areas for Opens in large VLSI Circuits"; IEEE Transactions on CAD of Integrated Circuits and Systems; vol. 18 No. 2; Feb. 1999; pp. 151–162.*

E.C. Carlson, et al., "A Scanline Data Structure Processor for VLSI Geometry Checking," *IEEE Transactions on Computer–Aided Design*, vol. CAD–6, No. 5, Sep. 1987.

T.G. Symanski, et al., "Space Efficient Algorithms for VLSI Artwork Analysis," Bell Laboratories, IEEE 20th Design Automation Conference, Paper 46.3, 1983.

L.Seiler, "A Hardware Assisted Design Rule Check Architecture," Massachusetts Institute of Technology, IEEE 19th Design Automation Conference, Paper 16.3, 1982.

R. Kane, et al., "A Systolic Design Rule Checker," University of Minnesota, IEEE 21st Design Automation Conference, Paper 16.3, 1984.

G.E. Bier, et al., "An Algorithm for Design Rule Checking on a Multiprocessor", The University of Wisconsion–Madison, IEEE 22nd Design Automation Conference, Paper 20.2, 1985.

B.W. Lindsay, et al., "Design Rule Checking and Analysis of IC Mask Designs," Sandia Laboratories.

(List continued on next page.)

*Primary Examiner*—Matthew Smith
*Assistant Examiner*—Jibreel Speight
(74) *Attorney, Agent, or Firm*—Sughrue, Mion, Zinn, Macpeak & Seas, PLLC

(57) ABSTRACT

The method and apparatus for performing design rule checking on Manhattan structures in VLSI circuit layouts. The method and apparatus provides an edge-endpoint-based technique for checking the geometry and spacing of the VLSI circuit layout. The edge-endpoint-based technique uses a scanline algorithm that detects errors between adjacent structures that do not simultaneously intersect the scanline. The method also provides efficient error compilation. The apparatus allows for the design rules to be changed as the VLSI circuit layout evolves. The apparatus can process the VLSI circuit layout with a single processor, and the apparatus provides for multiple processors to process slices of the VLSI circuit layout, thereby enhancing the speed of the design rule checking over traditional software-only techniques.

51 Claims, 13 Drawing Sheets

OTHER PUBLICATIONS

U. Lauther, "An O (N log N) Algorithm For Boolean Mask Operations", Siemens AG, IEEE 18$^{th}$ Design Automation Conference, Paper 27.1, pp. 555–562, 1981.

"MOSIS Scalable CMOS (SCMOS) Design Rules," Revision 7.3, The MOSIS Service, Apr. 1999.

* cited by examiner

CURRENT SCANLINE

| Y-COORDINATE | LAYER | O | D | P | X-EXTENSION |

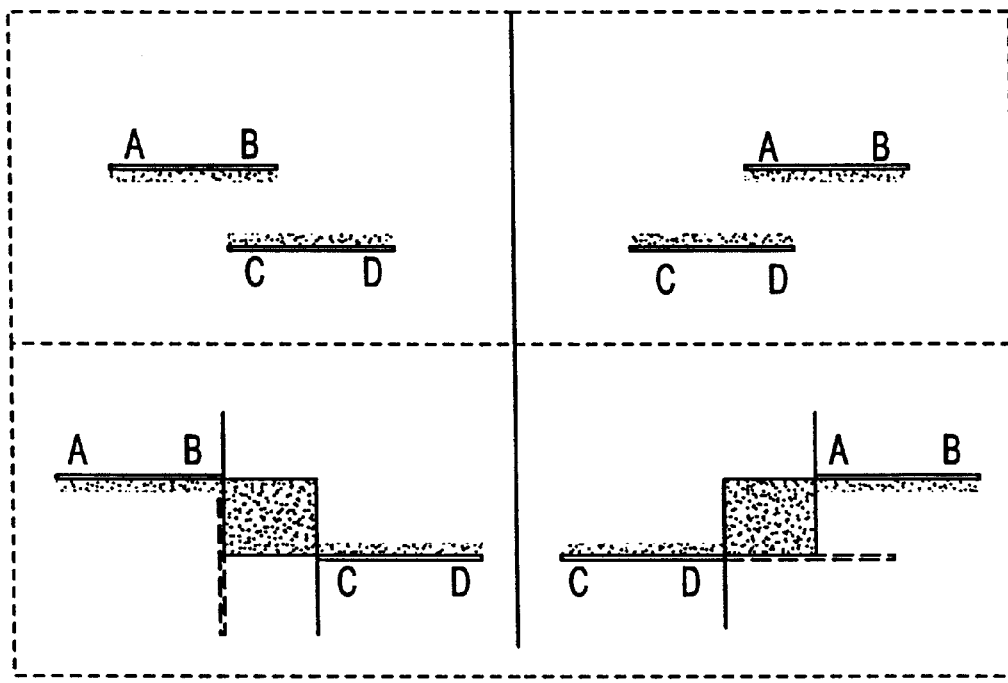
FIG. 6A  FIG. 6B
FIG. 6C  FIG. 6D
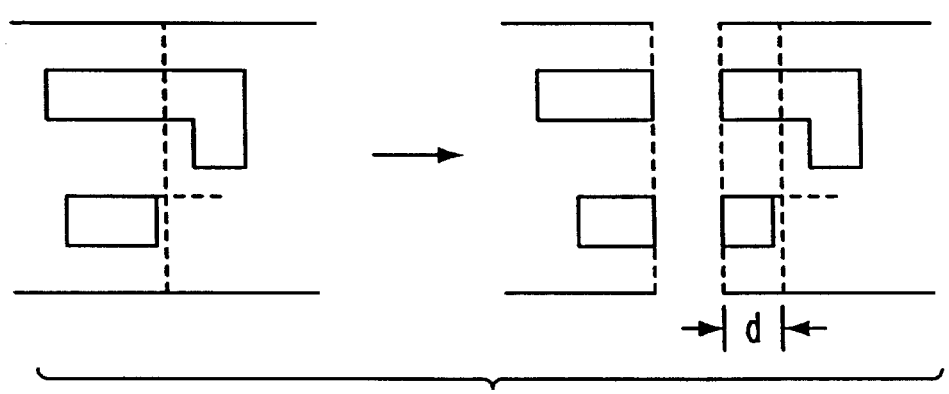
FIG. 7

METHOD AND APPARATUS FOR EDGE-ENDPOINT-BASED VLSI DESIGN RULE CHECKING

CROSS-REFERENCES TO RELATED APPLICATIONS

This application is an application filed under 35 U.S.C. §111(a), claiming benefit pursuant to 35 U.S.C. §120 of the filing date of the Provisional Application Ser. No. 60/116,047 filed on Jan. 14, 1999, pursuant to 35 U.S.C. §111(b). The Provisional Application Serial No. 60/116,047 is incorporated herein by reference for all it discloses.

BACKGROUND OF INVENTION

1. Field of Invention

This invention is directed to a method, apparatus and software for acceleration of design rule checking of integrated circuit mask layouts. The invention is embodied in a method for checking an integrated circuit mask layout against predetermined design rules using endpoints. The invention is also embodied in apparatus that checks an integrated circuit mask layout against predetermined design rules. The invention is also embodied in computer software that checks an integrated circuit mask layer against predetermined design rules.

2. Description of Related Art

The use of hardware for acceleration of Design Rule Checking (hereinafter "DRC") is known in the art. Previous hardware acceleration techniques concentrate on custom-designed hardware approaches. Design rules, however, evolve with the advance of integrated circuit technology. When new layers are introduced or design rules are modified, the design rule checking hardware has to be re-designed and re-fabricated to keep up with the changes. To avoid this situation, previous approaches only accelerate universal primitives of design rule checking. On the other hand, although design rules will change and they vary between different fabrication lines, their fundamental structures are similar. A general hardware structure is required for DRC that is applicable to design rules of different fabrication processes, and this structure should be adaptable to a specific system. Unlike custom-designed hardware, configurable hardware imposes many constraints, and none of the existing hardware acceleration methods are suited for configurable DRC computing.

DRC takes, as input, a low-level description of the mask layers and features required for a particular integrated circuit design. The CAD tool on which the layout was created produces such data. The goal of DRC is to identify places in the integrated circuit design where the design rules, such as the spacing between two features or the width of a wire, have been violated. Design rules are specified in terms of a parameterized width factor, typically referred to as lambda ("λ"). This parameterized width factor allows the same design rules to be used as the feature size of the process changes. In spite of this, design rules change frequently and many fabrication processes, particularly in the sub-micron domain, will have subtly different design rules.

There are two major types of design rule checking methods. Bitmap methods were widely used in early prior art methods. The layout is rasterized into a grid of square cells, with each mask layer represented by a separate bit in each cell. Bitmaps are attractive because of the simplicity of some operations such as Boolean operations (e.g., the AND function performed between two masks) and space/width checking. Many bitmap approaches are based on Baker's algorithm. Baker's algorithm uses a 3×3 window to do the checking of minimum width of 2 bits and a 4×4 window to do the checking of minimum width of 3 bits.

There are, however, disadvantages to the prior art bitmap techniques. First, bitmaps require processing a large amount of data; this, in turn, requires large amounts of memory bandwidth and high parallelism in order to produce results with acceptable performance.

The second disadvantage is that in a design system where the grid spacing (i.e., the minimum feature spacing) is much smaller than the minimum feature size, a much larger window size is required to check for width or spacing errors. This, in turn, dictates that significant time will be spent comparing error templates with windows.

Edge-based techniques, on the other hand, use edges to represent regions in each mask layer. The amount of data needed in general is reduced and is less dependent on the mask resolution. A one-dimensional systolic architecture for design rule checking for Manhattan structures has been proposed (i.e., structures with only horizontal and vertical features intersecting at ninety-degree angles). The edge files are divided into horizontal edges and vertical edges and each set is processed independently. Horizontal edges are checked for vertical width errors and horizontal spacing errors; vertical edges are checked for horizontal width errors and vertical spacing errors. The disadvantages of this approach are that it requires seemingly impractical amount of hardware and it imposes too many restrictions on input edges.

Most of the edge-based approaches, instead, use variations on scanline algorithms. Mask layer data is transformed into an edge file that contains all non-vertical edges in the mask. Each edge is described by a pair of points, ($X_{min}$, $Y_{min}$) and ($X_{max}$, $Y_{max}$), along with an orientation field indicating if the edge borders the region from above or below. Additional layer information is needed when multiple layers are handled together. The edges are sorted in a canonical order by non-decreasing order of slope within $Y_{min}$ and $X_{min}$ before processing.

A vertical scanline sweeps horizontally across the whole mask and only stops at the X-coordinates of all the edge endpoints. Edges that intersect the current scanline are then processed. This approach requires less hardware than previously discussed methods.

These prior art methods, however, suffer from several drawbacks:

(a) First, edge-based processing leads to a fairly wide data path. For Manhattan structures, at least three coordinate fields ($X_{min}$, $X_{max}$ and Y) are required for each edge: two X-coordinates for beginning and ending points and one Y-coordinate for the edge. If each coordinate requires 18 bits, 54 bits are required to store these three coordinates. This size requirement, in turn, imposes constraints on hardware size, overall system cost and system performance.

(b) Second, when an intermediate layer (for example, the gate layer) is generated in an edge-based algorithm, its edge file is not in canonical order, since the edge with the smallest X-coordinate of its ending point is output first. Thus, an intermediate sort is needed. This intermediate sort adds complexity to the control and data flow in the hardware system and extra hardware cost for temporary storage.

(c) Third, no prior art exists that fully addresses the edge-reconciliation problem. A general method to obtain computational parallelism in DRC is to cut each mask layer into pieces and process each piece individually. This is possible both in bit-map approaches and edge-based algorithms. Spurious width/spacing errors, however, could be generated by the DRC system because some regions are split into pieces. Sewing regions back together imposes non-trivial performance degradations (especially for edge-based approaches) when the mask is divided into many small pieces.

SUMMARY OF INVENTION

The present invention has been made in view of the above circumstances and has as an object to overcome the above problems and limitations of the prior art, and has a further object to provide an integrated circuit design rule checker, capable of overcoming the above and other problems associated with the prior art.

Additional objects and advantages of the present invention will be set forth in part in the description that follows and in part will be obvious from the description, or may be learned by practice of the invention. The objects and advantages of the invention may be realized and attained by means of the instrumentalities and combinations particularly pointed out in the appended claims.

The above and other objects of the present invention are accomplished by providing a method for analysis of an integrated circuit mask layout against predetermined design rules using a scanline. The method includes the step of transforming an integrated circuit mask layout into a plurality of endpoints and sweeping a scanline through the plurality of endpoints, pausing at predetermined intervals. The sweeping of the scanline further includes decomposing the plurality of endpoints into pluralities of true points, true endpoints and old points at each of the predetermined intervals. The sweeping of the scanline further includes evaluating the plurality of true points and the plurality of true endpoints against predetermined design rules at each of the predetermined intervals along the scanline path, and flagging any violations of the predetermined design rules. Sweeping of the scanline further includes compiling any violations of the predetermined design rules for later use.

The endpoints of the integrated circuit mask layout are represented in a particular format, consisting of an X-coordinate field, a Y-coordinate field, a layer field, an orientation field, a directional field and a processing field. The method of the present invention then groups the endpoints in canonical order.

The method of the present invention further includes using counters to determine if certain endpoints are inside a bounded region. If the point is inside the bounded region, then it is not a true point and merits no further evaluation. The present invention also merges points evaluated at the preceding scanline with the points intersecting the current scanline, and evaluating the merged points against predetermined design rules.

The method of the present invention will add a virtual extension of predetermined value to endpoints meeting a certain criteria, in order to catch a particular type of design rule violation. The method also adds virtual extensions to edges represented by endpoints that intersect at mask slicing points.

The method of the present invention includes criteria for the prevention of excessively repetitive error collection. Repeated errors will be ignored or removed by the method of the present invention.

The above and other objects of the present invention are accomplished by providing a computer system for analysis of an integrated circuit mask layout against predetermined design rules using a scanline. The computer system transforms an integrated circuit mask layout into a plurality of endpoints and sweeping a scanline through the plurality of endpoints, pausing at predetermined intervals. The sweeping the scanline by the computer system further includes decomposing the plurality of endpoints into pluralities of true points, true endpoints and old points at each of the predetermined intervals. The sweeping of the scanline by the computer system further includes evaluating the plurality of true points and the plurality of true endpoints against predetermined design rules at each of the predetermined intervals along the scanline path, and flagging any violations of the predetermined design rules. Sweeping of the scanline by the computer system further includes compiling any violations of the predetermined design rules for later use.

The above and other objects of the present invention are accomplished by providing a computer program product for enabling a computer to analyze an integrated circuit mask layout against predetermined design rules using a scanline. The computer program product causes a computer system to transform an integrated circuit mask layout into a plurality of endpoints and sweeping a scanline through the plurality of endpoints, pausing at predetermined intervals. The sweeping the scanline caused by the computer program product further includes decomposing the plurality of endpoints into pluralities of true points, true endpoints and old points at each of the predetermined intervals. The sweeping of the scanline by the computer program product further includes evaluating the plurality of true points and the plurality of true endpoints against predetermined design rules at each of the predetermined intervals along the scanline path, and flagging any violations of the predetermined design rules. Finally, sweeping of the scanline by the computer program product further includes compiling any violations of the predetermined design rules for later use.

The above and other objects of the present invention are accomplished by providing an apparatus for analysis of an integrated circuit mask layout against predetermined design rules using a scanline. The apparatus includes a processor for transforming the integrated circuit mask layout into a plurality of endpoints and sweeping the scanline through the plurality of endpoints. The processor pauses at predetermined intervals. The apparatus further includes a design rule processor for decomposing the plurality of endpoints into pluralities of true points, true endpoints and old points at each of the predetermined intervals. The design rule processor evaluates the pluralities of true points and endpoints against the predetermined design rules at each of the predetermined intervals along the scanline. The design rule processor flags violations of the predetermined design rules, and compiles violations of the predetermined design rules for later use.

The processor transforms the endpoints of the integrated circuit mask layout into a particular format, consisting of an X-coordinate field, a Y-coordinate field, a layer field, an orientation field, a directional field and a processing field. The processor of the present invention then groups the endpoints in canonical order.

The apparatus of the present invention further includes using counters to determine if certain endpoints are inside a bounded region. If the point is inside the bounded region, then it is not a true point and merits no further evaluation. The apparatus of present invention also merges points evaluated at the preceding scanline with the points intersecting the current scanline, and evaluates the merged points against predetermined design rules.

The apparatus of the present invention will add a virtual extension of predetermined value to endpoints meeting a certain criteria, in order to catch a particular type of design rule violation. The apparatus also adds virtual extensions to edges represented by endpoints that intersect at mask slicing points.

The apparatus of the present invention uses criteria for the prevention of excessively repetitive error collection. Repeated errors will be ignored or removed by the apparatus of the present invention.

The design rules processor of the present invention includes an access circuit, a first, second and third memories, a merge/sorter, a rules checker, and an error memory. The access circuit allows the processor to interface with the design rule processor. The first memory stores endpoints received from the processor. The second memory stores the output of the rules checker.

The design rules processor of the present invention may further include a merge/sorter the merges the points stored in the first memory with points stored in the second memory. The rules checker evaluates the predetermined design rules against the output from the merge/sorter. Th rules checker will generate an error when it finds a violation of the predetermined design rules, and the error memory stores design rule violations from the rules checker.

The apparatus of the present invention can be implemented in programmable circuitry, such as an FPGA or an ASIC. The FPGA or ASIC can be fixed or removable.

The apparatus of the present invention can include a plurality of design rule processors, all linked to a single processor via a bus. Each design rule processor will evaluate a slice of the integrated circuit mask layout simultaneously. The scanline is swept through all the design rule processors simultaneously.

BRIEF DESCRIPTION OF DRAWINGS

The accompanying drawings, which are incorporated in and constitute a part of this specification, illustrate embodiments of the invention and, together with the description, serve to explain the objects, advantages and principles of the invention. In the drawings.

FIGS. 6A–6D illustrate adjacency between edges;

FIG. 7 illustrates the concept of mask slicing and its attendant results;

DETAILED DESCRIPTION OF THE INVENTION

A detailed description of the present invention will now be given referring to the accompanying drawings.

Figure 11:
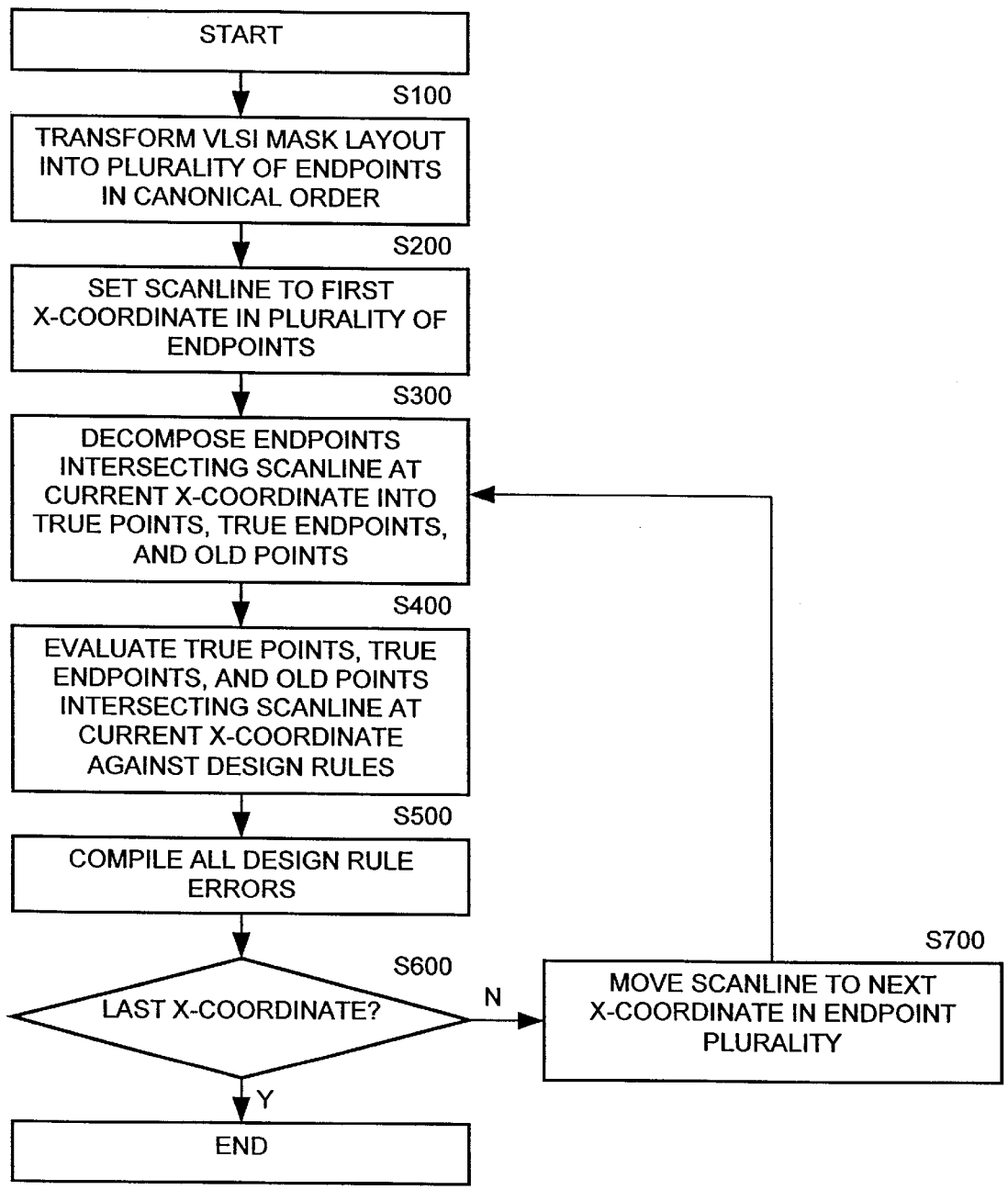
FIG. 11 illustrates the basic process flow of the present invention.

The method and apparatus of the present invention performs DRC on Manhattan structures. The basic process steps of the present invention are illustrated in FIG. 11. The present invention uses a variant of the scanline algorithm discussed in the Background, and is amenable for configurable hardware. Further, the present invention is capable of solving the problems in (b) and (c) outlined in the Background regarding scanline techniques.

Scanline algorithms are so-named because they sweep a virtual line, called the "scanline," across the individual edges comprising the mask. Only those edges that intersect the current scanline need to be considered at any given time.

A scanline algorithm can be described as follows. Consider a vertical scanline sweeping from left to right across the edges of a mask. The scanline stops at the endpoints of every polygon edge and collects all edges that begin, end or cross this virtual line. This is the mechanism for locality: only those edges that encounter the scanline need to be considered. By maintaining appropriate state information between successive scanline stops, most of the actual checking operations simply involve stepping through the active edges on the scanline in the appropriate order. For example, both Boolean operations and preliminary region numbering can be done by processing edges top to bottom in the scanline, being careful to maintain the appropriate state information between each edge. In fact, much of the computation time accrues to the tedious but fairly simple tasks of relocating the scanline to the next location, and stepping through the active edges on the current scanline. The scanline filters out the "true" edges, i.e., those edges that represent the desired output mask.

It is convenient to decompose scanline algorithms into two component pieces: "scanline maintenance" and "scanline processing." Scanline maintenance computes where the scanline will stop next, and provides the set of sorted edges that are encountered by the current scanline. Scanline processing operates only on the edges in the current scanline, and performs the desired mask checking functions, for example, Boolean combinations or region numbering.

Figures 1, 2:
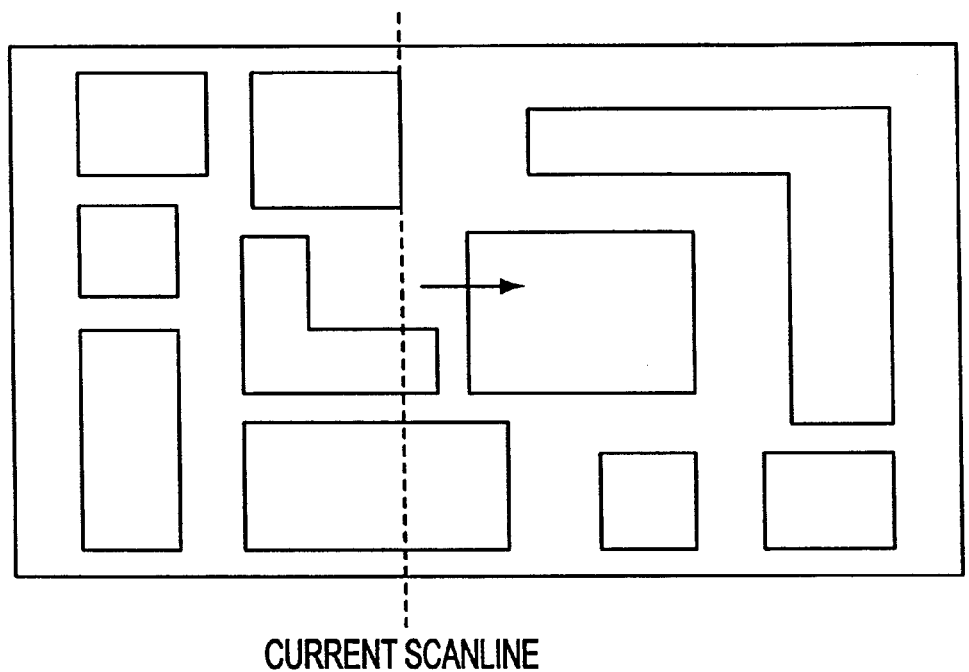
FIG. 1 illustrates a sample scanline sweeping over a VLSI mask.
FIG. 2 illustrates the format that is employed to represent an endpoint.

FIG. 1 depicts the usage of a scanline in the present invention. The approach of the present invention uses a "virtual" scanline that passes over the mask layers, checking relevant design rules as it sweeps across the mask design. In order to check vertical spacing or widths, the scanline will be oriented vertically, as shown in FIG. 1. In order to check horizontal spacing or widths, the mask is rotated by ninety degrees counterclockwise and the scanline will be swept across the rotated design.

The method of the present invention will now be described in general terms. FIG. 11 illustrates the process flow of the present invention, and more detailed explanations of the various steps will be given below. At Step S100, the invention receives an integrated circuit mask layout that was created in a predetermined format. The integrated circuit mask layout is transformed into a plurality of endpoints represented in a particular format, and the endpoints are further sorted into canonical order. At Step S200, the scanline is positioned at the first X-coordinate that is listed in the canonically ordered endpoints. At Step S300, the present invention decomposes the endpoints that intersect the scanline into true points and true endpoints. This step also creates old points, which are points that are representative of an edge that has been previously processed. At Step S400, after the decomposition, all relevant points that intersect the scanline are evaluated against the appropriate design rules. At Step S500, after the evaluation, any design errors are compiled, and repetitive errors are eliminated. At Step S600, the present invention determines whether it is finished sweeping through the plurality of endpoints. If not, in Step S700, the scanline is moved to the next X-coordinate and the process continues until all X-coordinates have been evaluated.

The transforming of an integrated circuit mask layout into a plurality of endpoints as performed by the present invention will now be described in greater detail.

The method of the present invention uses an edge-endpoint-based representation. In the present invention, all the edges in a mask layer are categorized into horizontal edges and vertical edges, each of which is processed separately. The present invention can process maskworks stored in a variety of formats, i.e., CIF, GDSII, etc. For clarity, only the processing of endpoints associated with horizontal edges will be discussed. Endpoints associated with vertical edges will be processed in exactly the same manner after the mask is rotated ninety degrees.

The representation of an endpoint as a numerical value will now be described in detail. FIG. 2 depicts the representation of an endpoint in the format of the present invention. The Y-coordinate field represents the Y-coordinate of the edge endpoint.

As shown in FIG. 2, the L-bit field, or the Layer field, indicates in which mask layer the endpoint is located.

Figure 10:
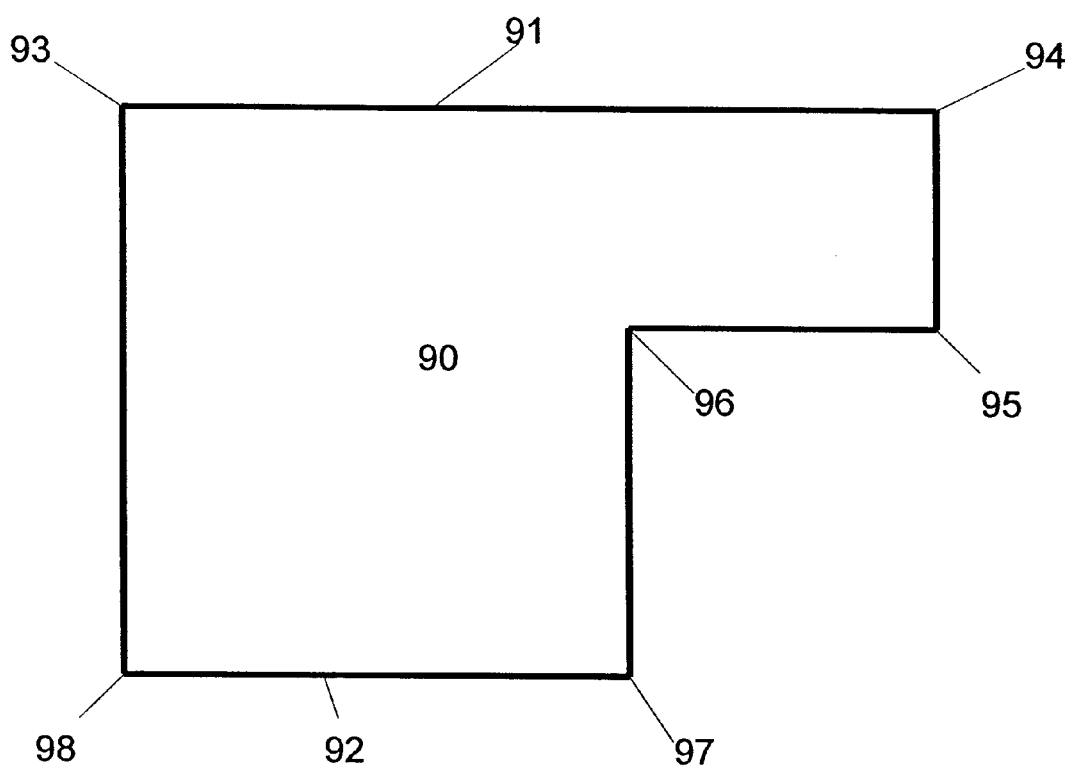
FIG. 10 illustrates the concepts of forward edge, backward edge, and starting endpoints and ending endpoints.

As shown in FIG. 2, the O-bit field, or the Orientation field, indicates the orientation of the edge with which the endpoint is associated. If the edge is a forward edge (i.e., the edge is the border above the region), then the O-bit field is set to zero. If the edge is a backward edge (i.e., the edge is the border below the region), then the O-bit field is set to one. As shown by FIG. 10, forward edge 91 borders region 90 at its uppermost y-coordinate. Likewise, backward edge 92 borders region 90 lowermost y-coordinates.

As illustrated by FIG. 2, the D-bit field, or the Directional field, indicates the direction of the current endpoint. If the endpoint is the starting endpoint of the associated edge, then the D-bit field is set to zero. If the endpoint is the ending endpoint of the associated edge, then the D-bit field is set to one. As illustrated by FIG. 10, endpoint 93 is a starting endpoint and endpoint 94 is an ending endpoint. Endpoints on a forward edge 91 are denoted as either forward starting endpoints 93 or forward ending endpoints 94. Endpoints on a backward edge are denoted as either backward starting endpoints 96,98 or backward ending endpoints 95,97.

As shown by FIG. 2, the P-bit field, or the Processing field, indicates if the endpoint has been processed previously. For the endpoints generated from mask layer data, the P-bit field is set to zero and the X-extension field is set to zero. The P-bit field and the X-extension field will be discussed in greater detail below.

The present invention maintains the endpoints in a canonical order. All the endpoints are sorted in an increasing order by X-coordinate, Y-coordinate, layer and orientation. Two endpoints in the initial edge file "cancel" each other if they only differ in the D-bit field.

After endpoints are sorted, they are divided into groups of the same X-coordinate. Within each group, endpoints are sorted in an increasing order by their first three fields. As illustrated in FIG. 2, there is no X-coordinate information in the endpoint representation. Instead, a special endpoint of layer zero is created to carry the X-coordinate by its Y-coordinate field and inserted before each endpoint group of same X-coordinate.

The sweeping of a scanline through the canonically ordered endpoints and pausing at predetermined intervals will now be described in greater detail.

Scanline algorithms are so-named because they sweep a virtual line, called the "scanline," across the individual edges comprising the mask. Only those edges that intersect the current scanline need to be considered at any given time.

The predetermined intervals that the present invention pauses at are the X-coordinates found as the result of the canonical sort performed on the transformed endpoints. An evaluation of the integrated circuit mask layout against the predetermined design rules is performed as necessary at each X-coordinate found in the canonical sort. It is unnecessary to evaluate scanline intersections at any other X-coordinates.

The decomposition of the endpoints into true points, true endpoints and old points due to the sweeping of a scanline through the canonically ordered endpoints will now be described in greater detail.

When the scanline is at X-coordinate $X_c$, the present invention categorizes and sorts the pending edges as follows:

1) $X_{min}=X_c$, i.e., the edge starts from this scanline. This is referred to as a category one endpoint.

2) $X_{max}=X_c$, i.e., the edge ends at this scanline. This is referred to as a category two endpoint.

3) $X_{min}<X_c<X_{max}$, i.e., the edge intersects this scanline. This is referred to as category three point.

Endpoints from categories one and two are called new endpoints with the P-bit field set to zero since they have never been processed before. Category three points are "inherited" from the previous scanline. Each time a category one endpoint is processed, it is passed along to the next scanline. A category three point inherits all the information from the category one endpoint except that now the P-bit field is set to one since the edge has been previously processed. The present invention refers to category three points as "old points."

The present invention processes the points intersecting the scanline in an interactive fashion. As stated above, the points (i.e., old points, true points and true endpoints) that intersected with the scanline at the previous X-coordinate are merged with the points of the current scanline intersection. This merged group of points is then sorted in canonical order. During the merge, the present invention removed old points when they encounter the ending endpoints (category two) of the edge. That is, when an old point encounters the endpoint of its particular edge, the old is removed and not evaluated against the design rules.

Figure 3:
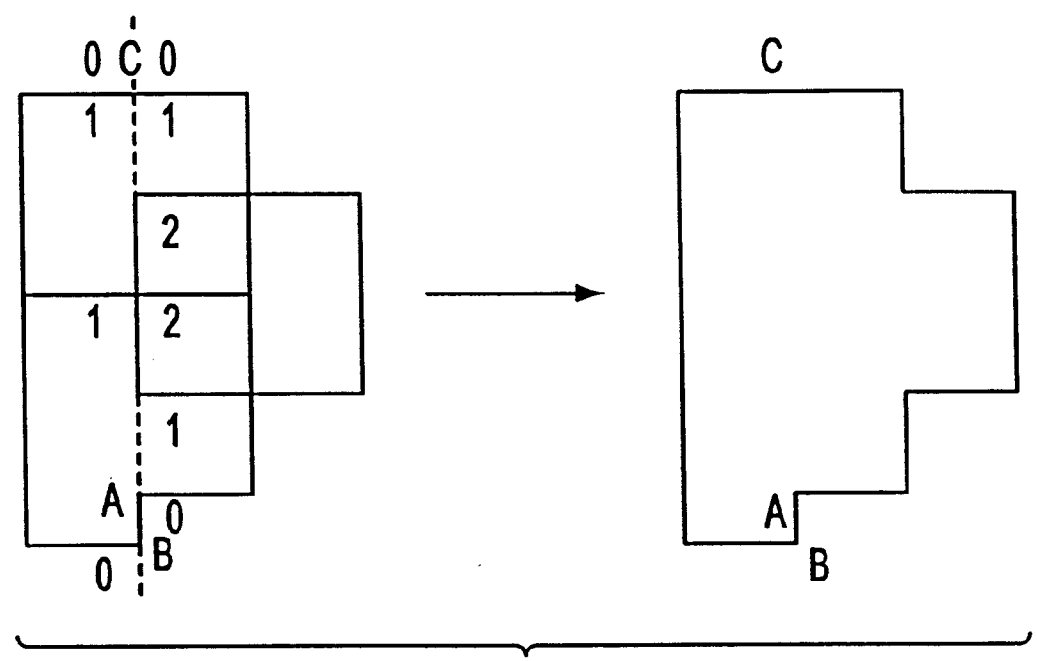
FIG. 3 illustrates the technique of true point filtering.

FIG. 3 illustrates that the input data from the CAD tool can contains overlapped and coincident regions in some layers. These regions should be logically ORed to get the final region profile. A point, whether it is an old point or a starting/ending endpoint of an edge, is called a true point if it is on the boundary of the final region. Points that are inside the boundary of the final region are not identified as true points. An endpoint is called a true endpoint, if it is one of the endpoints of the final region. Thus, only true points are considered in the design rule checking.

The further decomposition of the plurality of points into true points and true endpoints will now be described in further detail. To help filter in the true points, the present invention utilizes two counters for each layer: LC and RC. These counters are reset to zero after the current scanline has finished its processing. That is, when the scanline moves to the next x-coordinate along the scanline path, LC and RC are cleared.

Figure 12:
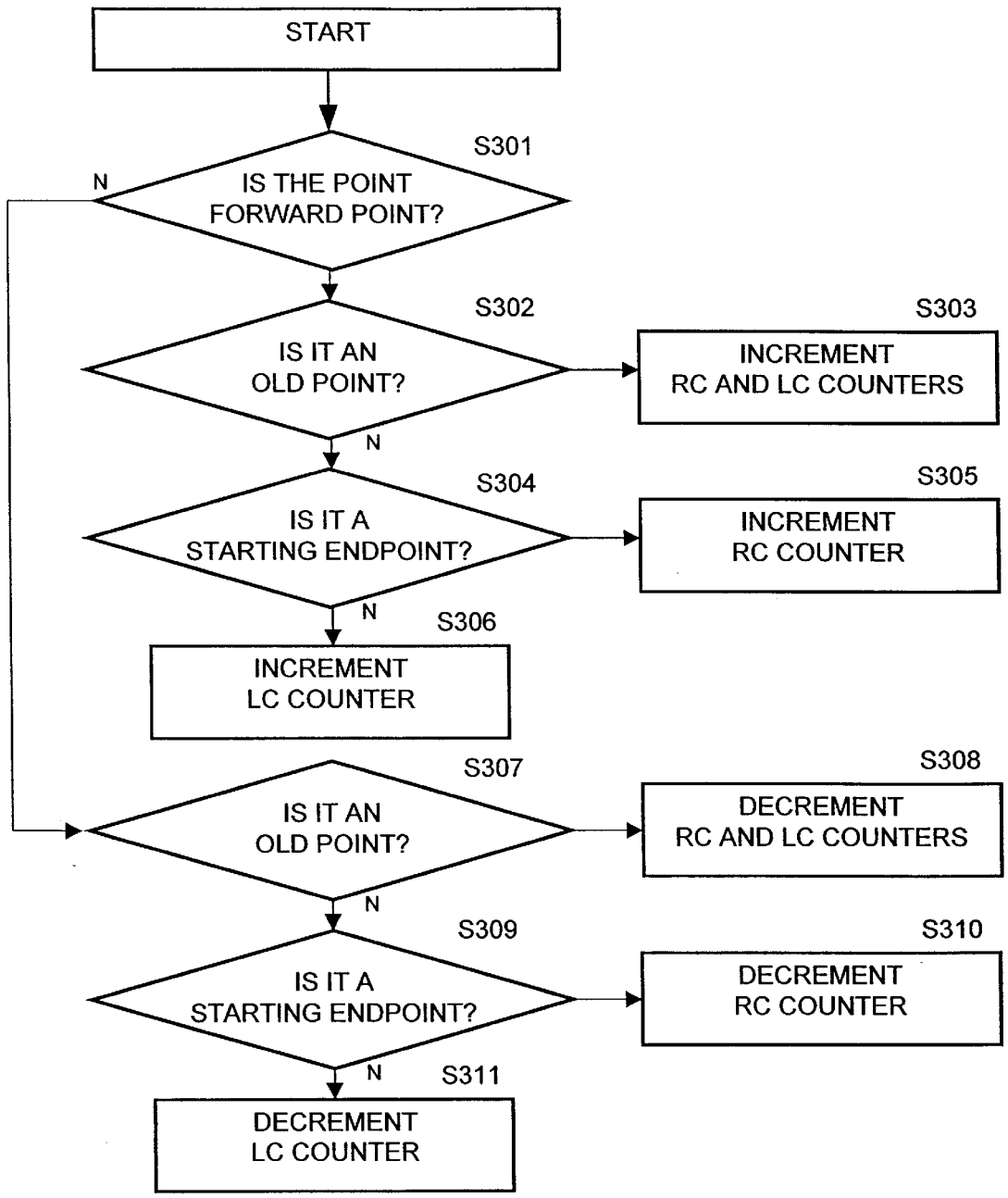
FIG. 12 illustrates the process flow of determining true points from a plurality of old points and endpoints.

FIG. 12 illustrates the process flow for the LC and RC counters as they process the points representing an edge from the uppermost y-coordinate to the lowest y-coordinate. When a point is processed by the present invention, the counters corresponding to its layer are updated in accordance with the following process flow. At Step S301, a determination is made as to when the point is a forward point or a backward point. If the point is a forward point, the next two determinations are specific to that point classification. At Step S302, if the point is an old point, the LC and RC counters increment in Step S303. Otherwise, at Step S304, if the point is a starting endpoint, the RC counter increments at Step S305. Otherwise, at Step S306, the point is an ending endpoint and the LC counter increments.

At Step S301, if the point is a backward point, the next two determinations are specific to that point classification. At Step S307, if the point is an old point, the LC and RC counters decrement in Step S308. Otherwise, at Step S309, if the point is a starting endpoint, the RC counter decrements in Step S310. Otherwise, at Step S311, the point is an ending endpoint and the LC counter decrements.

The LC counter indicates if the area on the left side and below the current position is inside or outside the final region. If the LC counter is greater than zero, the left side below the current position is inside the final region. If the LC counter equals zero, the left side below the current position is outside the final region. The LC counter should never be less than zero, however, unless there is an error in the endpoint file. The RC counter similarly indicates the situation on the right side of the current position.

FIG. 3 illustrates the counter update process. Point C is a forward old point, thus LC and RC counters increment. Point A is a backward starting endpoint, thus the RC counter decrements. Point B is a backward ending endpoint, thus the LC counter decrements.

In FIG. 3, both the left side and right side below Point C is inside the region, since LC>0 and RC>0. At Point A, the left side below it is inside the region and the right side below it is outside the region, since LC>0 and RC=0. Both the left side and right side of point C is outside the region, as indicated by LC=0 and RC=0.

Special care has to be taken when dealing with coincident points. In considering two coincident points, the most forward point of the two coincident points should always be processed first. This allows the present invention know that these two regions "overlap." In the present invention, this ordering is guaranteed by the canonical ordering of the endpoints.

Thus, a point is a true point if it changes the "inside the region" or "out of the region" status on either or both sides of the scanline. As shown in FIG. 3, points A, B and C are the true points of the current scanline. A point is a true endpoint, however, if it changes and only changes the region status on one side of the scanline. In FIG. 3, points A and B represent a true starting endpoint and a true ending endpoint, respectively. Point C is true old point.

Figure 5:
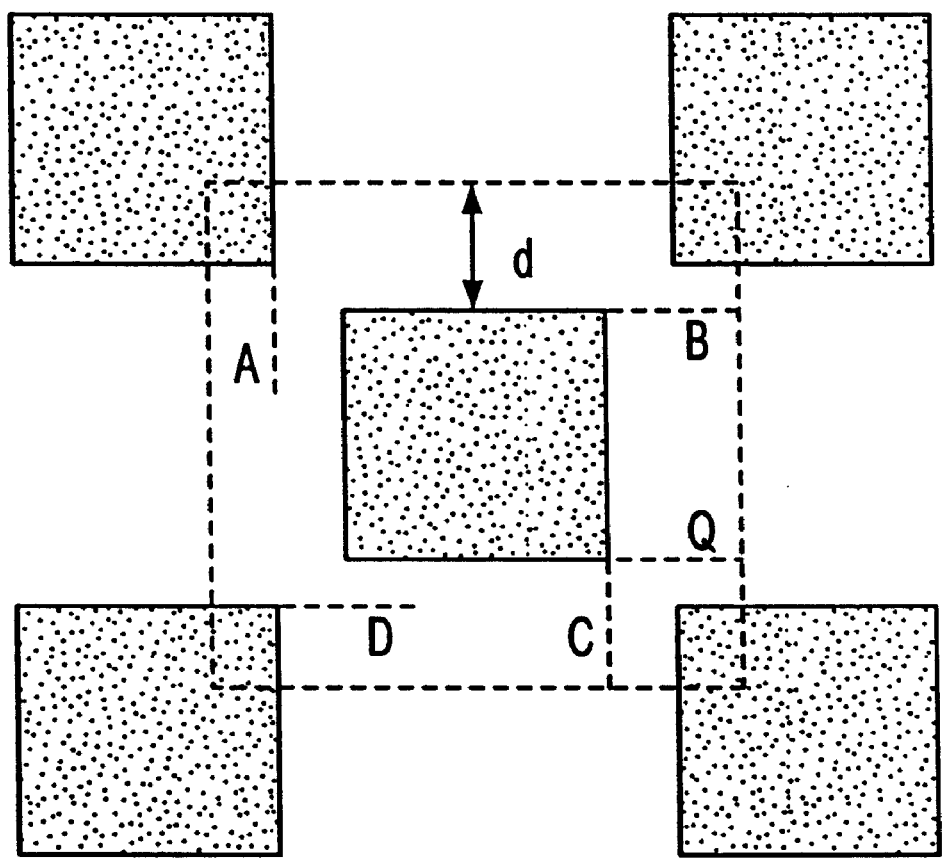
FIG. 5 illustrates virtual edges between five separate masked regions.

The present invention is able to find all the design rule errors along a scanline, except for a special type of error. As shown in FIG. 5, the central box has spacing errors with the surrounding four boxes. If the central box is expanded by the minimum space d, the expanded region (the dotted box in the center) will intersect all four surrounding boxes. This case escapes DRC because no scanline will cross both the edges from the central box and the four surrounding boxes around it.

The present invention extends certain edges of the central box or the surrounding boxes around it by predetermined length d. The extended edges are referred to as "virtual edges." Each point on a virtual edge is a virtual point. This virtual extension of an endpoint representing an edge allows the scanline processing to find any potential design rule violations and flag it.

A virtual point inherits the Y-coordinate, Layer and Orientation information from the edge that generates it. The present invention treats virtual points as old points, with the P-bit field set to one. The present invention uses the D-bit field to differentiate between a virtual edge and normal old edge. If the D-bit field is set to zero, then it is a virtual point; otherwise, it is a normal old point. Unlike normal old points that are automatically cancelled when they meet their ending endpoints, virtual points expire according to their X-extension bit field. When the virtual point is first generated, the X-extension bit field records the value of d. By way of example, assume the scanline moves to the right by $\Delta d$. After the current scanline has been processed, $\Delta d$ is subtracted from the X-extension bit field of all the virtual edges. After the subtraction, if the value of an X-extension bit field is less than or equal to zero, the corresponding virtual edge is cancelled. When multiple layers are present in an integrated circuit mask layout, the present invention sets the d value equal to the largest value of minimum width/spacing requirement for each particular layer.

Figure 13:
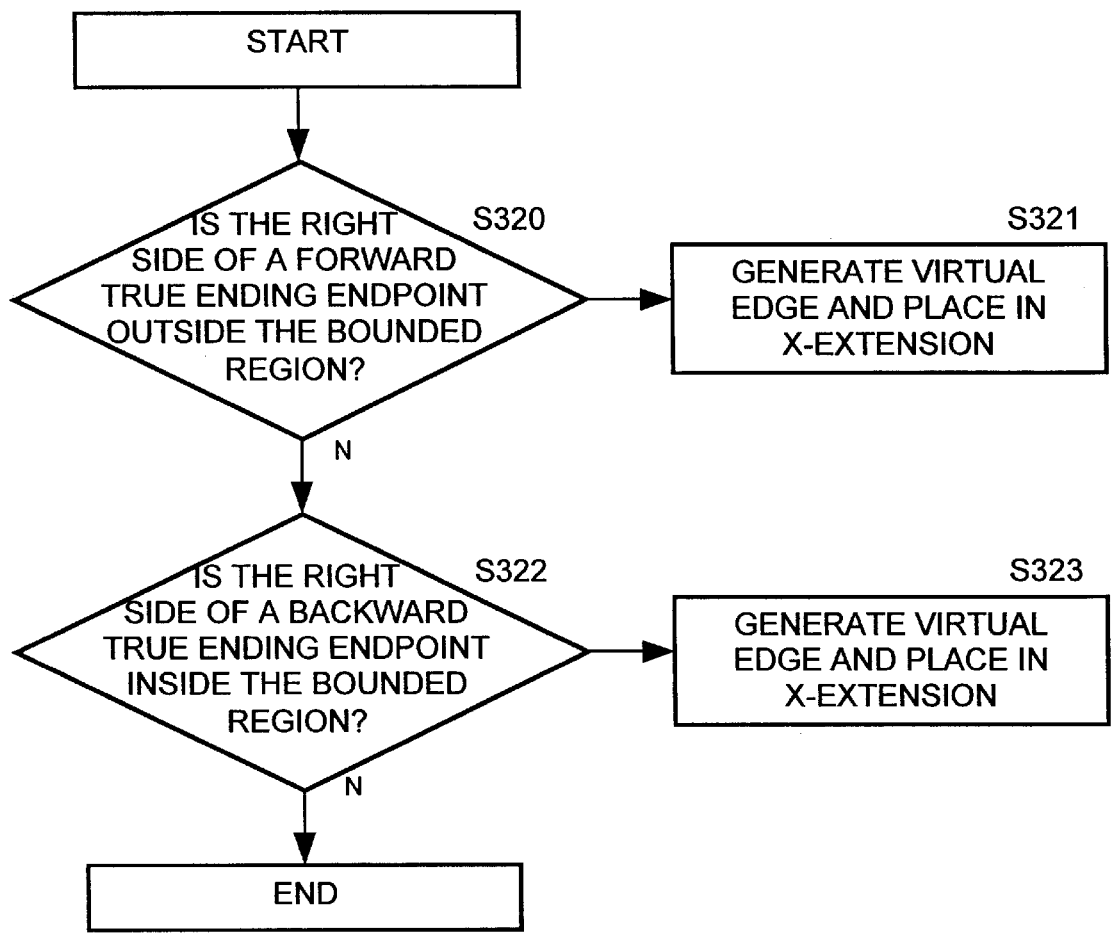
FIG. 13 illustrates the process flow of determining when to create virtual points.

The determination of whether to add a virtual edge will now be described in greater detail. FIG. 13 illustrates the process flow that minimizes the number of virtual edges that will be created by the present invention. As shown in FIG. 13, at Step S320, the present invention checks to see if the right side of a forward true ending endpoint is outside the bounded region. This test is used for space checking. If the forward true ending endpoint is outside the bounded region, then, at Step S321, the present invention generates a virtual edge and the data representing that virtual edge is placed in the X-extension bit field of the endpoint. At Step S322, the present invention checks to see if the right side of a backward true ending endpoint is inside the bounded region. This test is used for width checking. If the backward true ending endpoint is inside the bounded region, then, at Step S323, the present invention generates a virtual edge and the data representing that virtual edge is placed in the X-extension bit field of the endpoint. This test is used for width checking. If neither test is satisfied, no virtual edge is generated.

In FIG. 5, only virtual edges B and D are generated as horizontal virtual edges, and virtual edges A and C are generated as vertical virtual edges (Rotate FIG. 5 by ninety degrees counterclockwise). Q will not be generated, as the present invention will determine if any of the edges intrude into the box formed by C and Q. Thus, it is not necessary to check the distance to Q. Furthermore, a virtual edge will never update the Y-coordinate register of its layer.

The evaluation of true points and true endpoints against a set of predetermined design rules will now be described. As described above, the integrated circuit mask layout will only be evaluated against the predetermined design rules at scanline intersection points.

Design rule checking boils down to different instances of width checking. Space checking of a specific mask layer, for example, is equivalent to width checking on the inverse of such a mask. Other types of checking, such as minimum overlap, can all be transformed to width checking in a similar way. This does not mean, however, that the design has to be transformed into these intermediate forms before checking these rules. Instead, when multiple layers are present, all the rules that are associated with these layers can be checked simultaneously.

Design rule checking is also a locality problem in that only "adjacent" regions interact with each other. In a bitmap approach, this locality is utilized by means of pattern matching on a two-dimension window. In the edge-based approach, this locality is utilized by processing only adjacent true edges along the scanline. Adjacency not only refers to the adjacency within one layer, as well as among different layers. Point and edge adjacency are defined as follows:

Point A' from layer I' is said to be adjacent to point B' from layer J' (I' and J' could be the same layer) if no other point from layer I' or layer J' is inside or on the boundary of the rectangle formed by these two points. Edge L' and M' are said to be adjacent if there uniquely exists point A' within L' and point B' within M' and A'and B' are adjacent.

The definition allows recognition of design rule violations on these points by comparing point A and point B only (see FIG. 3). Since point C is further from point A than point B is, any design rule the point C violates with respect to point A will also be violated by point B (Different adjacencies will be relevant for different layers and design rules). Therefore, in the present invention, only the latest point of each layer along the scanline is stored in the Y-coordinate register of that layer for comparison with current true point.

Figure 4:
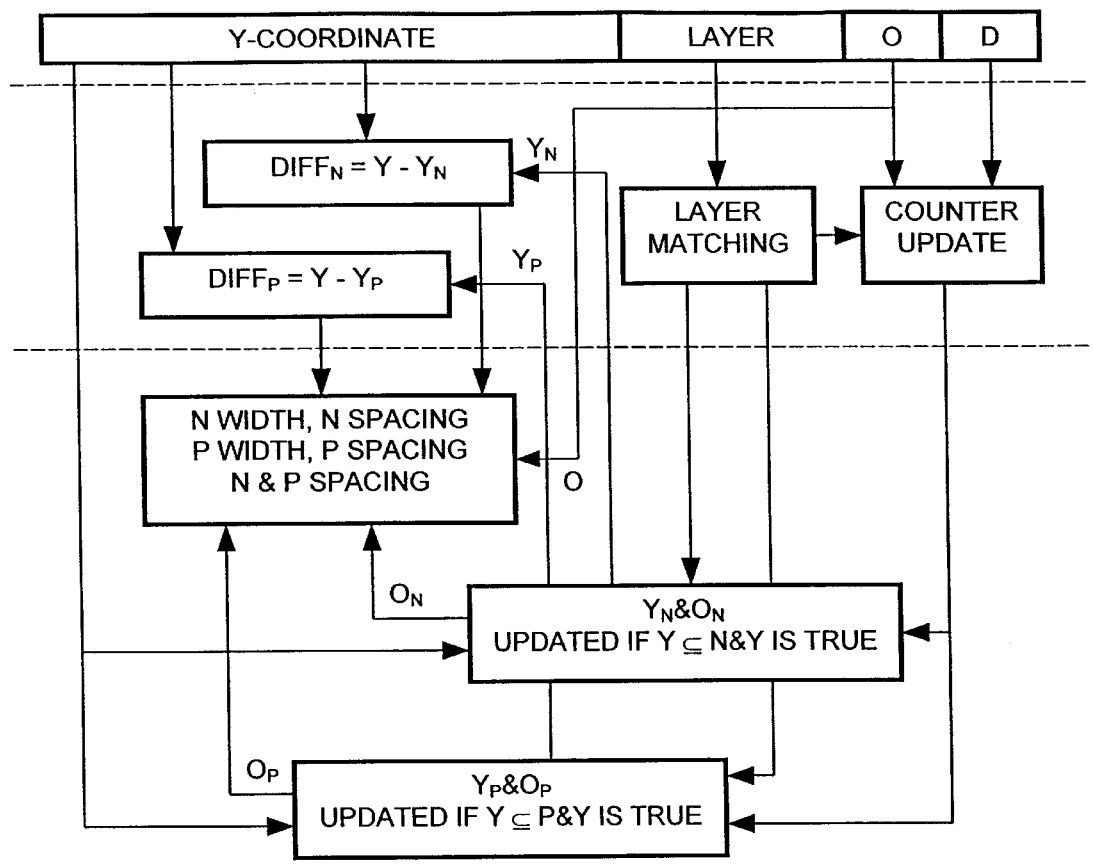
FIG. 4 illustrates the checking unit data flow for examining a endpoint for N and P layers.

Once a true point from a layer is determined, the checker circuit for each design rule needs: (1) the Y-coordinate differences between this point and all the latest points of each layer, and (2) the orientations of each point to find possible errors. FIG. 4 shows a block diagram of an embodiment for checking the design rules for N-type and P-type diffusion layers. As shown in FIG. 4, there are rules for minimum width of an N-type or P-type region, minimum spacing between two N-type regions, minimum spacing between two P-type regions and minimum spacing between an N-type region and a P-type region. Thus, when a true point in an N-type region is updated, the rule checker for minimum width of an N-type region is activated only if the latest N-type edge is a forward edge ($O_N=0$) and the current N-type edge is a backward edge ($O_N=1$). The rule checker for minimum spacing of an N-type region is activated only if the latest N-type edge is a backward edge ($O_N=1$) and the current N-type edge is a forward edge ($O_N=0$). The rule checker on spacing between an N-type region and a P-type region is activated only if the latest P-type edge is a backward edge ($O_P=1$) and the current N-type edge is a forward edge ($O_N=0$). Similar activation criteria apply for each design rule checked.

The dynamic downloading of design rules will now be explained. As described above, the integrated circuit mask layout is evaluated against the design rules at points of intersection with the scanline. The present invention includes the use of multiple groups of design rules in the evaluation of an integrated circuit mask layout. In some instances, a single set of design rules is suitable for the evaluation of a particular design. In other instances, multiple sets of design rules are necessary to properly evaluate the design. The present invention provides the ability to load a new set of design rules for certain portions of the integrated circuit mask layout. For example, a set of points ($P_1$), comprised of new endpoints and old points, has undergone the merging and true points filtering processes. The $P_1$ points are then evaluated against a first set of design rules ($DR_1$). A new set of points ($P_2$) undergo the merging and true points filtering processes. However, these points are to be evaluated against a second set of design rules ($DR_2$). The $DR_2$ rules are loaded prior to evaluating the $P_2$ point set, thereby overwriting the $DR_1$ rules. For the next set of points, the present invention can retain the $DR_2$ rules, reload the $DR_1$ rules or download a completely different set of design rules. The maximum number of different design rule sets equals the number of scanline intersections along the X-coordinate axis. New design rules are not downloaded while points that intersect a scanline are being evaluated.

The compilation of violations of the predetermined design rules by the integrated circuit mask layout will now be described in greater detail. To avoid flagging the identical error many times, the present invention only flags an error between current point and a latest point in the following two cases:

1) The current point is a true starting endpoint; or
2) The latest point is a starting endpoint and the current point is either a true point or a virtual point.

By following these two rules, the present invention avoids continually flagging repetitive errors.

The present invention, as described above, will find all the design rule errors between adjacent edges and will not generate repetitive errors. Width checking only needs to occur between two adjacent horizontal edges AB and CD (see FIGS. 6A–6D). As mentioned previously, other types of checking can be transformed to width checking and can be proved similarly. Referring to FIGS. 6A–6D, assume $Y_{AB}<Y_{CD}$, AB is a forward edge and CD is a backward edge and there is a width error between these two edges.

Case 1: $X_A \leq X_C \leq X_B$. The error will be found on any scanline that crosses the overlap part of these two edges, but the error will only be flagged when point C is processed.

Case 2: $X_C \leq X_A \leq X$. Similar to Case 1.

Case 3: $X_A<X_B<X_C<X_D$. Point B and point C should be adjacent, otherwise these two edges are not adjacent. Consider the vertical edge associated with point B. Since point B and point C are adjacent, point B can only be the ending endpoints of this vertical edge. For the same reason, point C can only be the starting endpoints of its vertical edge. Thus, point B will generate a vertical virtual edge and an error will be produced by this virtual edge at ($Y_B$, $Y_{CD}$).

Case 4: $X_C<X_D<X_A<X_B$. Point A and point D should be adjacent, otherwise these two edges are not adjacent. In this case, the rectangle formed by point A and point D should be inside the region, and thus point D will generate a horizontal virtual edge that will produce the error message at ($X_A$, $Y_{CD}$).

In all these four cases, the present invention avoids repetition of previously flagged errors.

Sometimes intermediate layers are needed for further design rule checking. For example, the gate layer is usually involved in many design rules, so it is more efficient to generate this intermediate layer for other design rule checking. Intermediate layers are the result of a Boolean operation of several layers. Thus, they can be filtered out using the techniques described for filtering true points. In the prior art, edges of the intermediate layers must be maintained in some fashion until their $X_{max}$ have been processed, and therefore the output edges are not in their canonical order. In the present invention, however, the endpoints of the intermediate layer do not have to be maintained, thus intermediate layer endpoints are generated in their canonical order and can be further processed while they are being generated.

The feature of the present invention allowing an integrated circuit mask layout to be separated into a plurality of mask slices will now be described in greater detail. As shown in FIG. 7, each mask layer can be sliced in vertical directions when dealing with horizontal edge endpoints and in horizontal directions when dealing with vertical edge endpoints. Each slice can be individually processed. Since all virtual edges crossing the cut disappear from the slice on the right, the present invention extends each slice a length d to ensure that these virtual edges are properly checked. Here d is the maximum length of all the virtual edges, which is equivalent to the largest minimum width/spacing required in all the design rules. There is a performance penalty of d/s, where s is the width of each resulting slice. A different design rule processor 80 can process each individual slice, thereby overcoming the performance penalty.

The present invention will not generate spurious errors during edge reconciliation because errors are only checked along the scanline direction. Repetitive errors can be generated by overlapped regions, but "ORing" the collected errors from all slices can easily remove the repetitive errors.

One embodiment of the present invention resides in a computer system. Hence, the term "computer system" is to be understood to include at least a memory and a processor. In general, the memory will store, at one time or another, at least portions of an executable program code, and the processor will execute one or more of the instructions included in that executable program code. It will be appreciated that the term "executable program code" and the term "software" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations.

An embodiment of the present invention is a computer system adapted for analysis of an integrated circuit mask layout against predetermined design rules using a scanline. The embodiment comprises a processor and a memory that includes software instructions adapted to enable said computer system to perform the step of transforming said integrated circuit mask layout into a plurality of endpoints. The software instructions would be further adapted to sweep a scanline through the plurality of endpoints, pausing at predetermined intervals. At each predetermined interval, the software instructions would be further adapted to decompose the plurality of endpoints into a plurality of true points, a plurality of true endpoints and a plurality of old points. The software instructions would command the computer system to evaluate the plurality of true points and the plurality of true endpoints against predetermined design rules at each of the predetermined intervals along said scanline, and violations of said predetermined design rules would be flagged. Finally, the computer system would compile the violations of said predetermined design rules for later use.

The present invention can be embodied in a computer program product, as will now be explained.

On a practical level, the software that enables the computer system to perform the operations may be supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media," or "computer-readable media," as used here, may include a diskette, a tape, a compact disc, an integrated circuit, a ROM, a CD, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet. Thus, the term, "computer readable medium" is intended to include all of the foregoing and any other medium by which software may be provided to a computer.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and includes but is not limited to all ways in which software is associated with a computer usable medium.

For the sake of simplicity, therefore, the term "program product" is thus used to refer to a computer useable medium, as defined above, which bears in any form of software to enable a computer system to operate according to the above-identified invention.

Thus, the invention is also embodied in a program product bearing software that enables a computer to perform analysis of an integrated circuit mask layout against predetermined design rules using a scanline. The program product embodiment includes software instructions adapted to enable said computer system to perform the step of transforming said integrated circuit mask layout into a plurality of endpoints. The program product would be further adapted to sweep a scanline through the plurality of endpoints, pausing at predetermined intervals. At each predetermined interval, the software instructions would be further adapted to decompose the plurality of endpoints into a plurality of true points, a plurality of true endpoints and a plurality of old points. The program product would command the computer system to evaluate the plurality of true points and the plurality of true endpoints against predetermined design rules at each of the predetermined intervals along said scanline, and violations of said predetermined design rules would be flagged. Finally, the program product would instruct the computer system to compile the violations of said predetermined design rules for later use.

The present invention is also embodied in an apparatus for analysis of an integrated circuit mask layout against predetermined design rules using a scanline. The embodiment would include a processor for transforming the integrated circuit mask layout into a plurality of endpoints. The processor would sweep the scanline through said plurality of endpoints, pausing at predetermined intervals, and decompose the plurality of endpoints into a true points, true endpoints and old points at each of said predetermined intervals. The embodiment further includes a design rule processor for evaluating the true points and true endpoints against the predetermined design rules at each of the predetermined intervals. The design rule processor would flag violations of the predetermined design rules and compile the design rule violation for further use.

The processor of the aforementioned embodiment of the present invention will now be described in greater detail.

To implement the present invention, the processor would transform the integrated circuit mask layout into a plurality of endpoints. As described above, the processor transforms the integrated circuit mask layout from the CAD tool format into endpoints having a particular representation format. Each endpoint transformed by the processor will have an X-coordinate field, a Y-coordinate field, a layer field, an orientation field, a directional field and a processing field.

After the integrated circuit mask layout has been transformed, the processor sorts the endpoints into canonical order based upon X-coordinate field, Y-coordinate field, layer field and orientation field. The processor further groups the sorted endpoints by the X-coordinate field, and removes the X-coordinate field from each group of sorted endpoints. As described above, a special layer is associated with each group of endpoints to carry the common X-coordinate information. During the sorting, the processor will delete endpoints that only differ by the directional field. The processor will use the common X-coordinate information contained in the special layer for determining where to pause the scanline.

The processor will also add virtual edges to endpoints that fit within the criteria described above for adding such extensions. In addition, if mask slicing is being used, the processor will add the required virtual extensions in order to maintain design rule integrity.

The design rule processor that is included in the aforementioned embodiment will now be described in greater detail.

Figure 8:
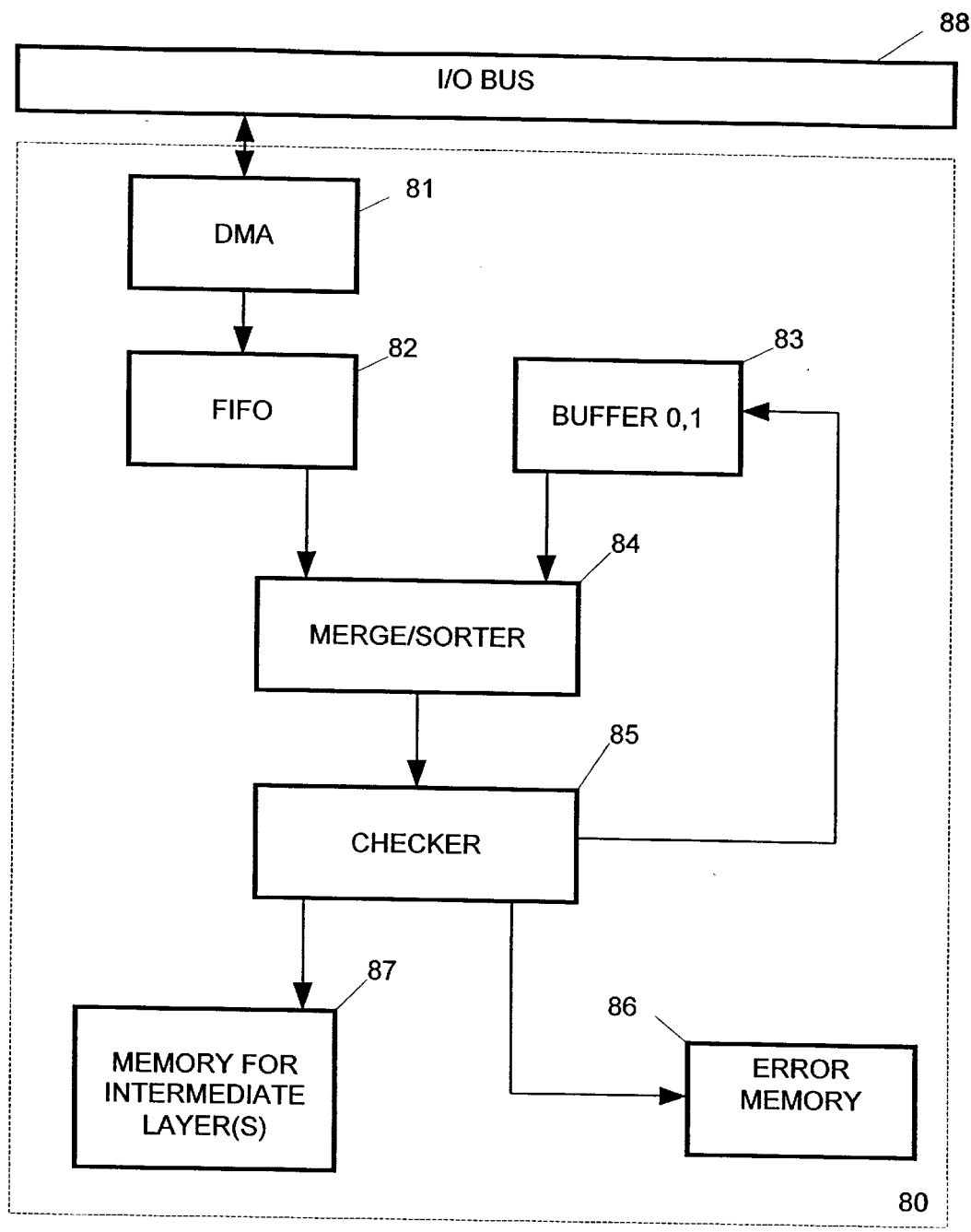
FIG. 8 illustrates the basic processing unit that is used to process mask endpoints.

As shown in FIG. 8, the DMA 81 and FIFO 82 of the design rule processor 80 unit receives the edge endpoints (i.e., new endpoints) from an input/output bus 88. DMA 81 forms an access circuit that allows the processor to interface with the design rule processor 80 via input/output bus 88. FIFO 82 is a first memory that stores the transformed endpoints sent from the processor.

The buffers 83 store endpoints inherited (i.e., old endpoints) from the previous scanline. The buffers 83 are a second memory for storage of the output of the rules checker 85. Since the design rules processor 80 generates the old points for the next scanline while consuming the old points generated by the previous scanline, two buffers 83 are maintained. Buffer 0 is being read while buffer 1 is being written and vice-versa. The second memory can be implemented as separate memories or a single dual port memory.

A merge/sorter 84 maintains the scanline. Since the data in the first memory and data in the second memory are in canonical order, the merge/sorter 84 does a simple two-way merge sort to generate the final data stream for processing, which will be canonically ordered.

In addition, the merge/sorter 84 also takes care of deleting old points and virtual points. An old point is deleted when its corresponding ending endpoint is met. Since each old point has the same representation as the corresponding ending endpoint except the P-bit field, which is the least significant bit in comparison, it will definitely meet the ending endpoint in the merge/sorter 84 and it will be deleted then.

For virtual points, the X-extension bit field of each virtual point is updated in the merge/sorter 84. Virtual points are cancelled if the X-extension bit field is less than or equal to zero.

Points of the current scanline, after being merge-sorted with old points inherited from the previous scanline, stream into the design rule processor 80 as shown in FIG. 8.

The rules checker 85 can be different for each design rule processor 80. The rules checker 85 evaluates the output of the merge/sorter 84 against the predetermined design rules. The basic structure is shown in FIG. 4. For each layer, the present invention requires a set of counters and an additional subtractor. Thus, the hardware cost grows almost linearly with the number of layers sent to each rules checker 85. The only exception is the number of design rules involved. If all layers processed by a rules checker 85 interact with each other, the number of design rules is roughly quadratic to the number of layers.

As described above, the rules checker 85 can be dynamically loaded with a different set of design rules for each set of points to be evaluated. For example, a set of points ($P_1$), comprised of new endpoints and old points, has passed through the merge/sorter 84. The $P_1$ points are then evaluated against a first set of design rules ($DR_1$) which have been loaded into the rules checker 85. A new set of points ($P_2$) is passed through the merge/sorter 84. However, these points are to be evaluated against a second set of design rules ($DR_2$). The $DR_2$ rules are loaded into the rules checker 85 prior to evaluating the $P_2$ point set, thereby overwriting the $DR_1$ rules. For the next set of points, the present invention can retain the $DR_2$ rules, reload the $DR_1$ rules or download a completely different set of design rules into the rules checker 85. The maximum number of different design rule sets equals the number of scanline intersections along the X-coordinate axis.

In the preferred embodiment, the processor will select the appropriate design rules for use in evaluating points along a given scanline. Prior to the evaluation, the desired design rule set is selected and then downloaded to the design rule processor 80. New design rules are not downloaded while points that intersect a scanline are being evaluated. In addition, the downloading of a new set of design rules does not affect the points in the merge/sorter 84, dynamically or otherwise.

The advantage presented by the ability to dynamically download design rule sets is twofold. First, even if the evaluation of a design will require the use of many sets of design rules, the single design rule processor 80 can be used, instead of a design rule processor programmed for each different design rule set. Second, the downloading and reprogramming time for the rules checker 85 will be negligible compared to the overall scanline processing time.

When an intermediate layer is required, the data from the rules checker 85 will be fed into one or more subsequent design rule processors. A third memory 87 is required for temporary storage of this intermediate layer. The merge/sorter 84 of the subsequent design rule processors can get the data from its own memory and from this third memory 87. The subsequent design rule processors do a preliminary merge/sort to keep the new endpoints in canonical order.

As described above, each mask layer can be sliced in vertical directions when dealing with horizontal edge endpoints (see FIG. 7) and in horizontal directions when dealing with vertical edge endpoints. Each slice can be individually processed by a separate design rule processor to overcome the performance penalty. Of course, each of the design rule processors implements an identical set of design rules.

The embodiment of the present invention is composed of one or more design rule processors 80 (see FIG. 8). The main processor and the design rule processor 80 may be implemented in various configurations, and may be implemented in an ASIC or an FPGA. Various implementations of design rules can be embodied with removable integrated circuits, allowing updates to easily be inserted into the design rule processor 80. As described above, ASICs or FPGAs that can be dynamically reprogrammed are preferable.

Figure 14:
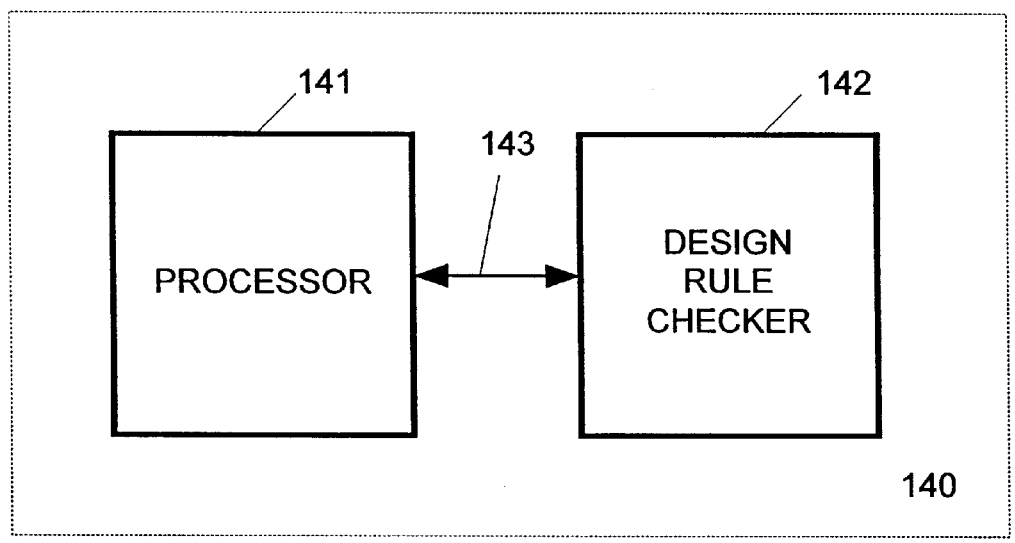
FIG. 14 depicts a first embodiment of the present invention.

FIG. 14 illustrates a first embodiment. The design rule checker 140 is comprised of a processor 141 and a design rule processor 142 within a single integrated circuit 140. A bus 143 allows communications between the processor 141 and the design rule processor 142.

Figure 15:
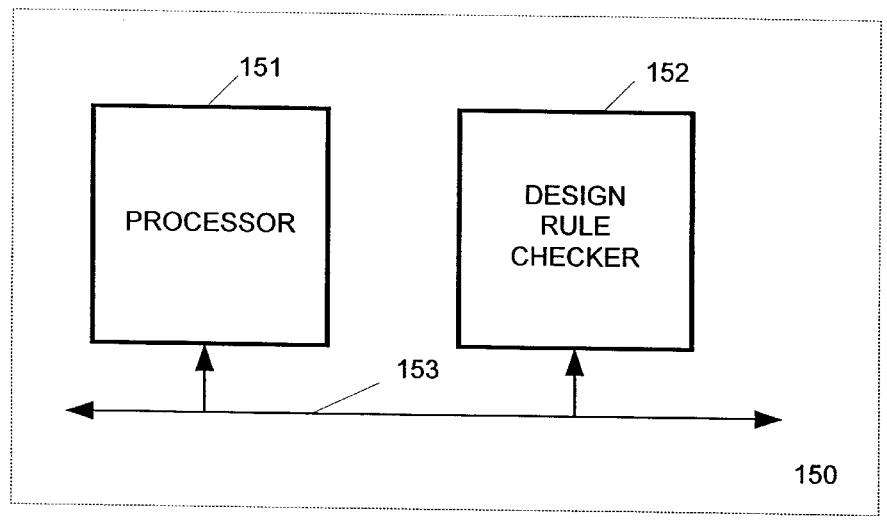
FIG. 15 depicts a second embodiment of the present invention.

FIG. 15 illustrates a second embodiment. The design rule checker 150 is comprised of a processor 151 and a design rule processor 152 connected over an interface bus 153. The processor 151 and the design rule processor 152 are separate entities, and communicate over the interface bus 153.

Figure 16:
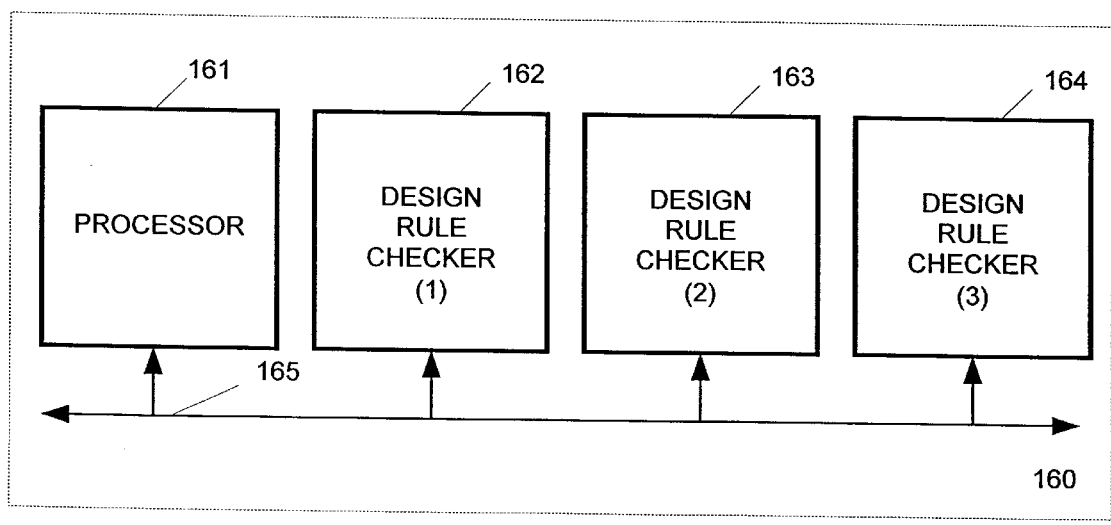
FIG. 16 depicts a third embodiment of the present invention.

FIG. 16 illustrates a third embodiment. The design rule checker 160 is comprised of a processor 161 and multiple design rule processors 162-4 connected to an interface bus 165. The processor 161 and the design rule processors 162-4 are separate entities, and communicate over the interface bus 163. This embodiment exploits the parallelism features of the present invention.

Figure 9:
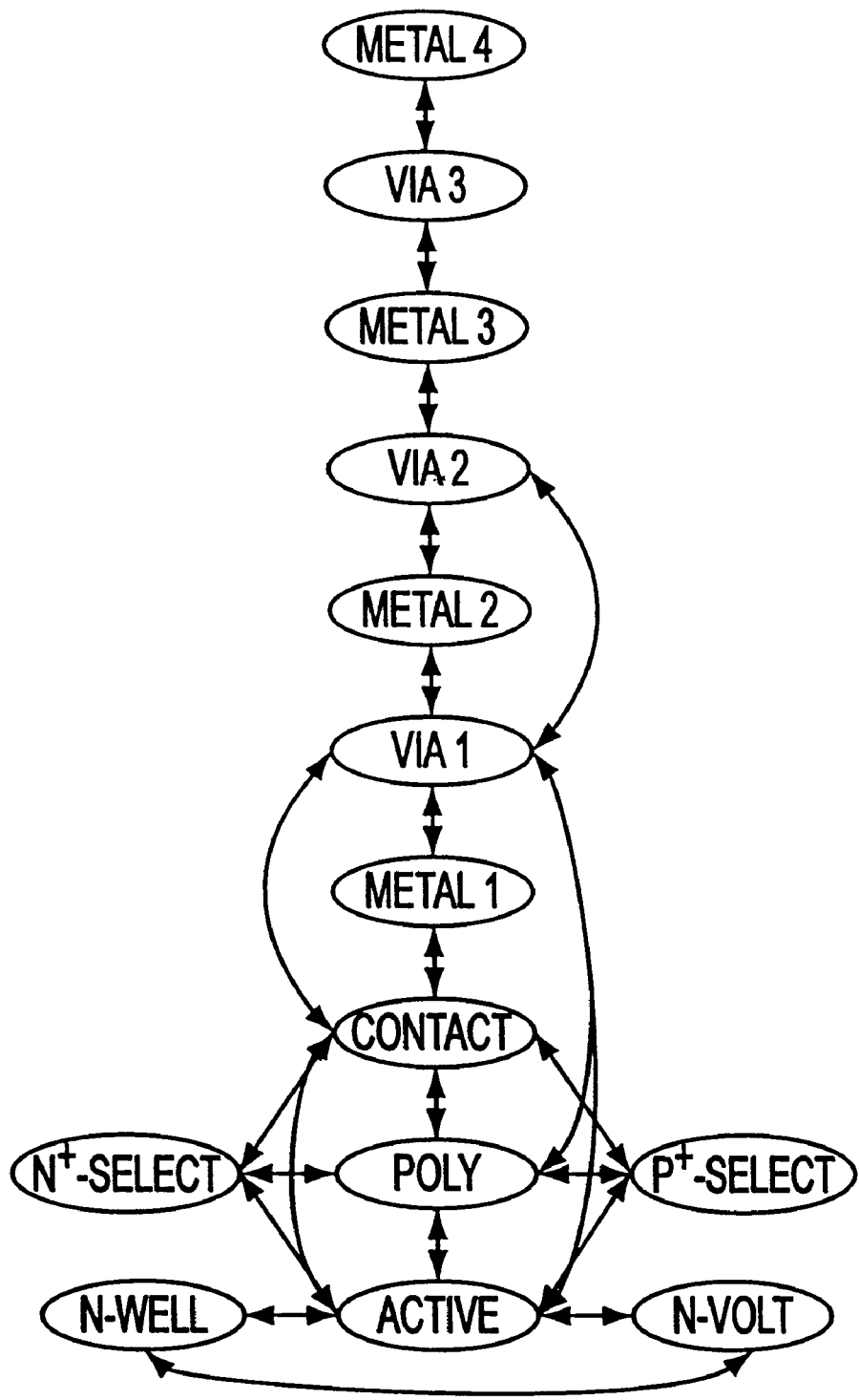
FIG. 9 illustrates the various layers of a VLSI mask and their interaction with each other.

To illustrate how the present invention can utilize parallelism, FIG. 9 illustrates the interaction of design of a typical VLSI circuit. An example of design rules for submicron fabrication of integrated circuits is the MOSIS SCN4M_SUBM rules. The circuit design rules of FIG. 9 require that the largest minimum width/spacing in these rules is 18 $\lambda$. The values of minimum width/spacing specified in the rules are all multiples of $\lambda$ except for a particular rule that requires 0.5 $\lambda$ spacing. This granularity impacts the total number of points that need to be processed for a given die size.

Assume all the endpoints on the layout are on a 0.5 $\lambda$×0.5 $\lambda$ grid. Since $\lambda$ equals 0.2 $\mu$m, the grid spacing is 0.1 $\mu$m. Assume that the maximum die width is 2.0 cm, which results in at most $2\times10^5$ points on a vertical line. Thus, 18 bits are required to store the X-coordinate and the Y-coordinate.

Since there are fourteen layers involved in the MOSIS SCN4M_SUBM design rules as shown in FIG. 9, four bits are used to store layer information. Since the largest minimum width/spacing is 18 $\lambda$ and the grid is 0.5 $\lambda$, the largest value for X-extension bit field would be thirty-six, so six bits are required to store the X-extension value. From FIG. 2, thirty-one bits are required for storing an edge endpoint. For simplicity, thirty-two bits are reserved for each endpoint and the one extra bit is given to the layer field since some intermediate layers might be generated on the fly.

All the edge endpoints can be sorted from all mask layers and sent through a huge checking unit to figure out all the design rule errors. The hardware requirement grows, however, more than linearly with the number of layers involved. As depicted in FIG. 4, each incoming endpoint's Y-coordinate will be sent to a subtractor. If there are more than fourteen subtractors in the hardware, the routing will be a big problem since the Y-coordinate is eighteen bits wide. Even if the routing were possible, huge routing delays would result. Since the subtraction is the bottleneck of the checking unit, the system speed will be significantly slowed down.

The present invention divides these layers into several groups and processes them independently. Through parallelism, the present invention speeds up the checking process over the check-all-in-one approach since each processing unit now only deals with a fraction of the total edge endpoints.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

Thus, while only certain embodiments of the invention have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein. It is intended that the scope of the invention be defined by the claims appended hereto, and their equivalents.

What is claimed is:

1. The method for analysis of an integrated circuit mask layout against predetermined design rules using a scanline, comprising:

transforming said integrated circuit mask layout into a plurality of endpoints;

sweeping said scanline through said plurality of endpoints, pausing at predetermined intervals, wherein sweeping said scanline further comprises:

decomposing said plurality of endpoints into a plurality of true points, a plurality of true endpoints and a plurality of old points at each of said predetermined intervals;

evaluating said plurality of true points and said plurality of true endpoints against said predetermined design rules at each of said predetermined intervals along said scanline, and flagging violations of said predetermined design rules; and compiling said violations of said predetermined design rules.

2. The method as set forth in claim 1, wherein transforming said integrated circuit mask layout further comprises representing each of said plurality of endpoints as a numerical value, consisting of an X-coordinate field, a Y-coordinate field, a layer field, an orientation field, a directional field and a processing field.

3. The method as set forth in claim 2, wherein transforming said integrated circuit mask layout further comprises:

sorting said plurality of endpoints in canonical order of said X-coordinate field, said Y-coordinate field, said layer field and said orientation field;

grouping said sorted plurality of endpoints by said X-coordinate field; and removing said X-coordinate field from each group of said sorted plurality of endpoints.

4. The method as set forth in claim 2, wherein transforming said integrated circuit mask layout further comprises removal of endpoints from said plurality of endpoints wherein said endpoints only differ in said directional field.

5. The method as set forth in claim 2, wherein said predetermined intervals correlate to the X-coordinates of said plurality of endpoints.

6. The method as set forth in claim 1, wherein decomposing said endpoints into said plurality of true endpoints further comprises using counters to determine if the intersection of said scanline with each of said endpoints is a true endpoint of a bounded region.

7. The method as set forth in claim 1, wherein decomposing said endpoints into said plurality of true points further comprises using counters to determine if the intersection of said scanline with each of said old points is a true point of a bounded region.

8. The method as set forth in claim 1, wherein decomposing said endpoints further comprises merging true points, true endpoints and old points that were compared to said predetermined design rules at a previous predetermined interval with the true points, true endpoints and old points currently intersecting said scanline, and sorting the merged true points, true endpoints and old points in canonical order.

9. The method as set forth in claim 8, wherein decomposing said endpoints into said plurality of old points further comprises deletion of old points that are no longer valid.

10. The method as set forth in claim 1, wherein decomposing said endpoints further comprises searching the most forward edge of coincident edges first for true points or true endpoints.

11. The method as set forth in claim 1, decomposing said endpoints further comprises adding a virtual extension of predetermined value to selected true endpoints for flagging violations of said predetermined design rules.

12. The method as set forth in claim 11, wherein adding a virtual extension further comprises determining if each of said selected true endpoints are true forward ending endpoints outside the edge of a bounded region, or a true backward ending endpoint inside a bounded region.

13. The method as set forth in claim 11, wherein evaluating said plurality of true points and said plurality of true endpoints against said predetermined design rules further comprises using said virtual extensions of said selected true endpoints to flag violations of said predetermined design rules.

14. The method as set forth in claim 1, wherein evaluating said plurality of true points and said plurality of true endpoints against predetermined design rules further comprises using at least two sets of predetermined design rules, each set of said predetermined design rules used at least once in evaluating said plurality of true points and said plurality of true endpoints.

15. The method as set forth in claim 1, wherein compiling said design rule errors further comprises discarding repetitive errors.

16. The method as set forth in claim 1, wherein transforming said integrated circuit mask layout further comprises dividing said integrated circuit mask layout into a plurality of mask slices, and sweeping said scanline across said mask slices simultaneously.

17. The method as set forth in claim 16, wherein the dividing of said integrated circuit mask layout into a plurality of mask slices further comprises extending all edges crossing the slice with a virtual edge of a predetermined length.

18. A computer system adapted for analysis of an integrated circuit mask layout against predetermined design rules using a scanline, comprising:
a processor; and
a memory including software instructions adapted to enable said computer system to perform:
transforming said integrated circuit mask layout into a plurality of endpoints;
sweeping said scanline through said plurality of endpoints, pausing at predetermined intervals, wherein sweeping of said scanline further comprises:
decomposing said plurality of endpoints into a plurality of true points, a plurality of true endpoints and a plurality of old points at each of said predetermined intervals;
evaluating said plurality of true points and said plurality of true endpoints against said predetermined design rules at each of said predetermined intervals along said scanline, and flagging violations of said predetermined design rules; and
compiling said violations of said predetermined design rules.

19. A computer program product for enabling a computer to perform analysis of an integrated circuit mask layout against predetermined design rules using a scanline, comprising:
software instructions for enabling said computer to perform predetermined operations, and a computer readable medium bearing said software instructions;
said predetermined operations including:
transforming said integrated circuit mask layout into a plurality of endpoints;
sweeping said scanline through said plurality of endpoints, pausing at predetermined intervals, wherein sweeping of said scanline further comprises:
decomposing said plurality of endpoints into a plurality of true points, a plurality of true endpoints and a plurality of old points at is each of said predetermined intervals;
evaluating said plurality of true points and said plurality of true endpoints against said predetermined design rules at each of said predetermined intervals along said scanline, and flagging violations of said predetermined design rules; and
compiling said violations of said predetermined design rules.

20. An apparatus for analysis of an integrated circuit mask layout against predetermined design rules using a scanline, including:
a processor for transforming said integrated circuit mask layout into a plurality of endpoints, sweeping said scanline through said plurality of endpoints, pausing at predetermined intervals, and
a design rule processor for decomposing said plurality of endpoints into a plurality of true points, a plurality of true endpoints and a plurality of old points at each of said predetermined intervals, evaluating said plurality of true points and said plurality of true endpoints against said predetermined design rules at each of said predetermined intervals along said scanline, flagging violations of said predetermined design rules, and compiling said violations of said predetermined design rules.

21. The apparatus as set forth in claim 20, wherein said processor transforms said integrated circuit mask layout into a plurality of endpoints, each consisting of an X-coordinate field, a Y-coordinate field, a layer field, an orientation field, a directional field and a processing field.

22. The apparatus as set forth in claim 21, wherein said processor sorts said plurality of endpoints in canonical order of said X-coordinate field, said Y-coordinate field, said layer field and said orientation field, groups said sorted plurality of endpoints by said X-coordinate field, and removes said X-coordinate field from each group of said sorted plurality of endpoints.

23. The apparatus as set forth in claim 21, wherein said processor removes endpoints from said plurality of endpoints wherein said endpoints only differ in said directional field.

24. The apparatus as set forth in claim 21, wherein said processor correlates said predetermined intervals to the X-coordinates of said plurality of endpoints.

25. The apparatus as set forth in claim 20, wherein said processor decomposes said endpoints using counters to determine if the intersection of said scanline with each of said endpoints is a true endpoint of a bounded region.

26. The apparatus as set forth in claim 20, wherein said design rule processor decomposes said endpoints using counters to determine if the intersection of said scanline with each of said endpoints is a true point of a bounded region.

27. The apparatus as set forth in claim 20, wherein said design rule processor merges true points, true endpoints and old points that were evaluated against said predetermined design rules at a previous predetermined interval with the true points, true endpoints and old points currently intersecting said scanline, and sorts the merged true points, true endpoints and old points in canonical order.

28. The apparatus as set forth in claim 27, wherein said design rule processor deletes old points that are no longer valid.

29. The apparatus as set forth in claim 20, wherein said design rule processor searches the most forward edge of coincident edges first for true points or true endpoints.

30. The apparatus as set forth in claim 20, wherein said processor adds a virtual extension of predetermined value to selected true endpoints for flagging violations of said predetermined design rules.

31. The apparatus as set forth in claim 30, wherein said design rule processor evaluates said plurality of true points and said plurality of true endpoints against said predetermined design rules using said virtual extensions of said selected true endpoints to flag violations of said predetermined design rules.

32. The apparatus as set forth in claim 20, wherein said design rule processor determines if each of said selected true endpoints are true forward ending endpoints outside the edge of a bounded region, or a true backward ending endpoint inside a bounded region.

33. The apparatus as set forth in claim 20, wherein said design rule processor uses at least two sets of predetermined design rules, each set of said predetermined design rules used at least once in evaluating said plurality of true points and said plurality of true endpoints.

34. The apparatus as set forth in claim 33, wherein said processor selects a set of predetermined design rules for said design rule processor to use for evaluating said plurality of true points and said plurality of true endpoints.

35. The apparatus as set forth in claim 34, wherein said design rule processor downloads said predetermined set of design rules prior to evaluating said plurality of true points and said plurality of true endpoints.

36. The apparatus as set forth in claim 20, wherein said design rule processor discards repetitive errors.

37. The apparatus as set forth in claim 20, wherein said design rule processor further comprises:
 an access circuit;
 a first memory;
 a second memory;
 a third memory;
 a merge/sorter;
 a rules checker; and
 an error memory.

38. The apparatus as set forth in claim 37, wherein said access circuit allows said processor to interface with said design rule processor.

39. The apparatus as set forth in claim 37, wherein said first memory stores said plurality of endpoints received from said processor via said bus circuit.

40. The apparatus as set forth in claim 37, wherein said second memory stores the output of said rules checker.

41. The apparatus as set forth in claim 37, wherein said second memory comprises a dual-port RAM.

42. The apparatus as set forth in claim 37, wherein said second memory comprises a double buffered memory.

43. The apparatus as set forth in claim 37, wherein said merge/sorter merges the points stored in said first memory with points stored in said second memory.

44. The apparatus as set forth in claim 37, wherein said merge/sorter sorts points into canonical order.

45. The apparatus as set forth in claim 37, wherein said rules checker evaluates said predetermined design rules against the output of said merge/sorter.

46. The apparatus as set forth in claim 37, wherein said error memory stores design rule violations from said rules checker.

47. The apparatus as set forth in claim 37, wherein said third memory is used for storage of intermediate data generated by said processor.

48. The apparatus as set forth in claim 37, wherein said design rule processor is an FPGA.

49. The apparatus as set forth in claim 37, wherein said design rule processor is an ASIC.

50. An apparatus for analysis of an integrated circuit mask layout against predetermined design rules using a scanline, including:
 a processor for transforming said integrated circuit mask layout into a plurality of endpoints, sweeping said scanline through said plurality of endpoints, pausing at predetermined intervals; and
 a plurality of design rule processors for decomposing said plurality of endpoints into a plurality of true points, a plurality of true endpoints and a plurality of old points at said predetermined intervals, evaluating said plurality of true points and said plurality of true endpoints against said predetermined design rules at said predetermined intervals along said scanline, flagging violations of said predetermined design rules, and compiling said violations for said predetermined design ruled.

51. The apparatus as set forth in claim 50, wherein said processor divides said integrated circuit mask layout into a plurality of mask slices, and said plurality of design rule processors sweep said scanline across said mask slices simultaneously.

\* \* \* \* \*